(12) United States Patent
Zhao

(10) Patent No.: US 11,068,235 B2
(45) Date of Patent: Jul. 20, 2021

(54) VOLUME ADJUSTMENT METHOD, TERMINAL DEVICE, STORAGE MEDIUM AND ELECTRONIC DEVICE

(71) Applicant: BAIDU ONLINE NETWORK TECHNOLOGY (BEIJING) CO., LTD., Beijing (CN)

(72) Inventor: Taotao Zhao, Beijing (CN)

(73) Assignee: BAIDU ONLINE NETWORK TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/859,875

(22) Filed: Apr. 27, 2020

(65) Prior Publication Data

US 2021/0019110 A1 Jan. 21, 2021

(30) Foreign Application Priority Data

Jul. 15, 2019 (CN) .......................... 201910634983.7

(51) Int. Cl.
*H03G 3/20* (2006.01)
*G06F 3/16* (2006.01)
(Continued)

(52) U.S. Cl.
CPC .............. *G06F 3/165* (2013.01); *G10L 25/51* (2013.01); *H03G 7/002* (2013.01); *H04R 29/001* (2013.01); *H04R 2430/01* (2013.01)

(58) Field of Classification Search
CPC ....................................................... H03G 3/20
See application file for complete search history.

(56) References Cited

U.S. PATENT DOCUMENTS

| 5,666,426 A | * | 9/1997 | Helms | ....................... H03G 3/32 |
| | | | | 381/104 |
| 6,868,262 B2 | * | 3/2005 | Gonya, Sr. | ............ H03H 11/245 |
| | | | | 330/254 |

(Continued)

FOREIGN PATENT DOCUMENTS

| JP | H1020885 A | 1/1998 |
| JP | 2010141468 A | 6/2010 |

(Continued)

OTHER PUBLICATIONS

First OA of the parallel JP application.

*Primary Examiner* — Olisa Anwah
(74) *Attorney, Agent, or Firm* — J.C. Patents

(57) ABSTRACT

The present disclosure provides a volume adjustment method, a terminal device, a storage medium, and an electronic device. The volume adjustment method provided by the present disclosure includes: acquiring ambient sound of current environment first and determining the main sound included in the ambient sound, where the main sound has a strongest preset sound characteristic among all sound types included in the ambient sound, and then adjusting a volume of the audio sound according to the main sound and a preset sound adjustment rule. The volume adjustment method provided by the present disclosure may enable the terminal device to adopt an adaptive adjustment manner to control the volume under different working environments, thereby outputting a volume that meets a user's current demand for the user.

16 Claims, 3 Drawing Sheets

(51) Int. Cl.
  *G10L 25/51*   (2013.01)
  *H03G 7/00*    (2006.01)
  *H04R 29/00*   (2006.01)

(56) References Cited

U.S. PATENT DOCUMENTS

| | | | |
|---|---|---|---|
| 8,194,866 B2* | 6/2012 | Smith | H04S 7/40 |
| | | | 381/56 |
| 2004/0218768 A1* | 11/2004 | Zhurin | H03G 3/32 |
| | | | 381/107 |
| 2008/0119221 A1* | 5/2008 | Wong | H04M 1/6033 |
| | | | 455/550.1 |
| 2012/0101819 A1* | 4/2012 | Heiman | H04R 5/04 |
| | | | 704/233 |
| 2015/0110276 A1* | 4/2015 | Gereb | G01H 3/125 |
| | | | 381/56 |
| 2015/0171813 A1* | 6/2015 | Ganatra | H03G 3/24 |
| | | | 381/57 |
| 2017/0105080 A1* | 4/2017 | Das | H04R 29/00 |
| 2018/0097493 A1* | 4/2018 | Weksler | H04R 3/00 |
| 2018/0132032 A1* | 5/2018 | Boesen | H04R 1/1091 |
| 2018/0352354 A1* | 12/2018 | Chandrashekar | H04R 29/001 |
| 2019/0372541 A1* | 12/2019 | Friant | H03G 3/3089 |
| 2019/0376838 A1* | 12/2019 | Frey | H04M 1/72406 |
| 2020/0252039 A1* | 8/2020 | Li | H04R 1/1041 |
| 2020/0272411 A1* | 8/2020 | Chen | G10L 25/51 |
| 2020/0296534 A1* | 9/2020 | Wang | H03G 5/165 |
| 2020/0329311 A1* | 10/2020 | Kalathur | H04R 3/04 |

FOREIGN PATENT DOCUMENTS

| | | |
|---|---|---|
| JP | 2019032387 A | 2/2019 |
| JP | 2020127066 A | 8/2020 |

* cited by examiner

VOLUME ADJUSTMENT METHOD, TERMINAL DEVICE, STORAGE MEDIUM AND ELECTRONIC DEVICE

CROSS-REFERENCE TO RELATED APPLICATION

This application claims priority to Chinese Patent Application No. 201910634983.7, filed on Jul. 15, 2019, which is hereby incorporated by reference in its entirety.

TECHNICAL FIELD

The present disclosure relates to the technical field of volume control, and in particular, to a volume adjustment method, a terminal device, a storage medium, and an electronic device.

BACKGROUND

With the development of electronic technology, intelligent speakers have gradually become a common electrical appliance in people's daily life. In addition to playing music on intelligent speakers, users can also interact with intelligent speakers through voice.

At present, intelligent speakers can be used for song requesting, online shopping or weather forecast information acquiring; further, the intelligent speakers can also be used to control intelligent home devices, such as opening curtains, setting a temperature of a fridge, and heating a water heater in advance.

However, when an intelligent speaker is playing guidance speech and resources, the playback volume is usually fixed; the intelligent speaker can adjust the volume only when the user sends an adjustment instruction to the intelligent speaker, which is less intelligent and affects user experience.

SUMMARY

The present disclosure provides a volume adjustment method, a terminal device, a storage medium, and an electronic device, to enable a terminal device to adopt an adaptive adjustment manner to control the volume under different working environments, thereby outputting a volume that meets a user's current demand for the user.

In a first aspect, the present disclosure provides a volume adjustment method, applied to a terminal device, and including:

acquiring ambient sound of current environment;

determining main sound included in the ambient sound, where the main sound has a strongest preset sound characteristic among all sound types included in the ambient sound, and the sound types include audio sound, human voice, and device sound, where the audio sound is played by the terminal device; and adjusting a volume of the audio sound according to the main sound and a preset sound adjustment rule.

In a possible design, the adjusting a volume of the audio sound according to the main sound and the preset sound adjustment rule, includes:

calculating a duration during which the human voice is monitored when the main voice is the human voice; and turning down the volume of the audio sound if the duration exceeds a first preset duration.

In a possible design, after the turning down the volume of the audio sound, the method further includes:

adjusting the volume of the audio sound to an original volume if a stop duration of the human voice exceeds a second preset duration.

In a possible design, the adjusting a volume of the audio sound according to the main sound and the preset sound adjustment rule, includes:

calculating a duration during which the device voice is monitored when the main voice is the device voice; and turning down the volume of the audio sound if the duration exceeds a third preset duration.

In a possible design, after the turning down the volume of the audio sound, the method further includes:

adjusting the volume of the audio sound to an original volume if a stop duration of the device voice exceeds a fourth preset duration.

In a possible design, the adjusting a volume of the audio sound according to the main sound and the preset sound adjustment rule, includes:

turning down the volume of the audio sound when it is unable to determine the main sound.

In a possible design, the adjusting a volume of the audio sound according to the main sound and the preset sound adjustment rule, includes:

determining identity information of a sounding object according to an adjustment instruction sound in the ambient sound; and determining a sound adjustment amplitude according to the identity information and the preset sound adjustment rule.

In a possible design, after the adjusting a volume of the audio sound according to the main sound and the preset sound adjustment rule, the method further includes:

stopping, by the terminal device, automatically adjusting the audio sound if the adjustment instruction sound is received within a preset fifth duration and the adjustment instruction sound is used to indicate the terminal device to adjust in a direction opposite to that of a latest sound adjustment.

In a second aspect, the present disclosure further provides a terminal device, including:

an acquiring module, configured to acquire ambient sound of current environment;

a processing module, configured to determine main sound included in the ambient sound, where the main sound has a strongest preset sound characteristic among all sound types included in the ambient sound, and the sound types include audio sound, human voice, and device sound, where the audio sound is played by the terminal device; and an adjusting module, configured to adjust a volume of the audio sound according to the main sound and a preset sound adjustment rule.

In a possible design, the adjusting module is specifically configured to:

calculate a duration during which the human voice is monitored when the main voice is the human voice; and turn down the volume of the audio sound if the duration exceeds a first preset duration.

In a possible design, the adjusting module is further configured to adjust the volume of the audio sound to an original volume if a stop duration of the human voice exceeds a second preset duration.

In a possible design, the adjusting module is specifically configured to:

calculate a duration during which the device voice is monitored when the main voice is the device voice; and turn down the volume of the audio sound if the duration exceeds a third preset duration.

In a possible design, the adjusting module is further configured to adjust the volume of the audio sound to an original volume if a stop duration of the device voice exceeds a fourth preset duration.

In a possible design, the adjusting module is specifically configured to:

turn down the volume of the audio sound when it is unable to determine the main sound.

In a possible design, the processing module is specifically configured to:

determine identity information of a sounding object according to an adjustment instruction sound in the ambient sound; and determine a sound adjustment amplitude according to the identity information and the preset sound adjustment rule.

In a possible design, the adjusting module is further configured to stop automatically adjusting the audio sound if the adjustment instruction sound is received within a preset fifth duration and the adjustment instruction sound is used to indicate the terminal device to adjust in a direction opposite to that of a latest sound adjustment.

In a third aspect, the present disclosure further provides a computer readable storage medium having a computer program stored thereon, where, the computer program, when executed by a processor, implements any possible volume adjustment method according to the first aspect.

In a fourth aspect, the present disclosure further provides an electronic device, including:

a processor; and a memory, configured to store executable instructions for the processor;

where the processor, by executing the executable instructions, is configured to perform any possible volume adjustment method according to the first aspect.

A volume adjustment method, a terminal device, a storage medium, and an electronic device provided by the present disclosure, by determining main sound included in ambient sound that is acquired by the terminal device, and adaptive adjusting a volume of the audio sound according to the main sound and a preset sound adjustment rule, enable the terminal device to adopt an adaptive adjustment manner to control the volume under different working environments, thereby outputting a volume that meets a user's current demand for the user.

BRIEF DESCRIPTION OF THE DRAWINGS

In order to more clearly illustrate embodiments of the present disclosure or technical solutions in the prior art, accompanying drawings required for describing the embodiments or the prior art will be briefly described below. Obviously, the accompanying drawings in the following description are some of the embodiments of the present disclosure, and other drawings can be obtained by those skilled in the art based on these accompanying drawings without any creative effort.

DESCRIPTION OF EMBODIMENTS

In order to make the purpose, technical solutions and advantages of embodiments of the present disclosure more clear, the technical solutions in the embodiments of the present disclosure are clearly and completely described in the following with reference to accompanying drawings in the embodiments of the present disclosure. Obviously, the described embodiments are some, instead of all, of the embodiments of the present disclosure. Based on the embodiments in the present disclosure, all other embodiments obtained by those skilled in the art without any creative effort are within the protection scope of the present disclosure.

Figure 1:
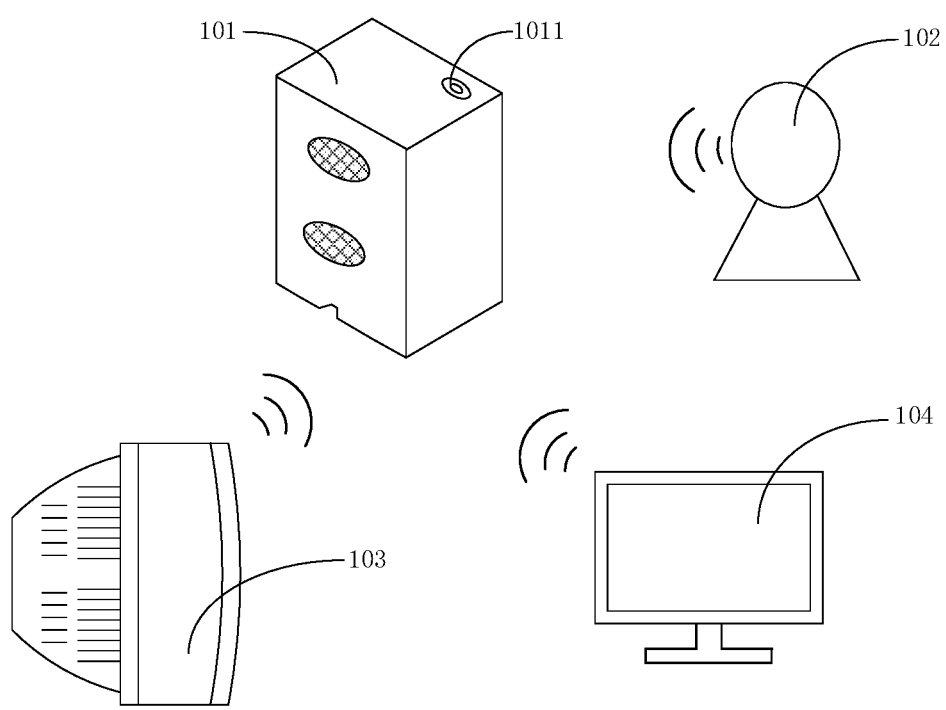
FIG. 1 is an application scenario diagram of a volume adjustment method according to an exemplary embodiment of the present disclosure.

FIG. 1 is an application scenario diagram of a volume adjustment method according to an exemplary embodiment of the present disclosure. As shown in FIG. 1, the volume adjustment method provided in the embodiment is applied to a terminal device, where the terminal device may be an electronic device with a pickup function and an audio playback function, such as an intelligent speaker, an intelligent phone, a personal computer, and an intelligent robot. It is worth noting that the specific form of the terminal device is not limited in the embodiment. However, for a detailed explanation of the implementation principle of the present application, an intelligent speaker 101 can be taken as an example. Since the intelligent speaker 101 will be set in various scenarios, such as a quiet home or a noisy shopping mall, ambient sound acquired by the intelligent speaker 101 is usually a mixture of various sounds, for example, including audio sound from the intelligent speaker 101 itself, human voice from a user 102, and device sound from other external devices (such as a television 103, a personal computer 104).

The intelligent speaker 101 is also equipped with a microphone 1011 that is used to pick up the ambient sound of the current environment.

Main sound included in the ambient sound is determined after the microphone 1011 successfully picked up the sound, where the main sound has a strongest preset sound characteristic among all sound types included in the ambient sound. For example, it can be the loudest sound, the most frequent sound, or the sound that lasts the longest. In an embodiment, the above sound types can include: audio sound, human voice, and device sound, where the audio sound is the one played by the intelligent speaker 101, such as sound of music currently played on the intelligent speaker 101.

Finally, a volume of the audio sound is adjusted according to the main sound and a preset sound adjustment rule. It is worth noting that, in daily life, when people talk to each other, they usually keep their voices in a fixed range. If the scenario is quiet, the volume is low; if the scenario is noisy and there are many other distractions, the volume will be slightly higher. The basic principle thereof is to make the listener hear clearly. However, when the intelligent speaker 101 is playing guidance speech and resources, the playback volume is usually fixed. In the embodiment, before the intelligent speaker 101 plays an audio, the main sound in the current environment is determined first, and then the volume of the audio sound of the sound played by the intelligent speaker 101 is adjusted adaptively according to the main sound and the preset sound adjustment rule.

Figure 2:
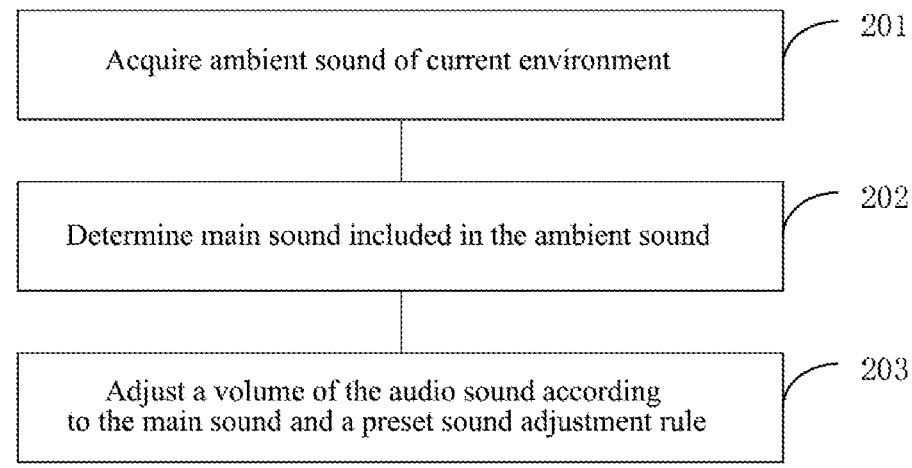
FIG. 2 is a schematic flowchart of a volume adjustment method according to an exemplary embodiment of the present disclosure.

FIG. 2 is a schematic flowchart of a volume adjustment method according to an exemplary embodiment of the present disclosure. As shown in FIG. 2, the volume adjustment method provided in the embodiment includes:

Step 201, acquire ambient sound of current environment.

Specifically, a terminal device may be employed, for example, a microphone on an intelligent speaker may be used to pick up the ambient sound from a user. Where the ambient sound usually includes a variety of different types of sound, for example: audio sound from the intelligent speaker itself, human voice from the user, and device sound from other external devices.

The human voice can specifically be from a person who is talking or from some persons who are talking; in an embodiment, a volume of the human voice at this time can be recorded. The device sound from other external devices can be, for example, sound of a television, or audio sound played by other devices; in an embodiment, a volume of the human voice at this time can be recorded. The audio sound from the intelligent speaker itself can be sound made when the guidance speech or audio and video resources is played externally while the intelligent speaker is working.

In an embodiment, when the intelligent speaker is working, a volume monitoring module in the intelligent speaker, such as the microphone, monitors the current working environment and records all the volume in the current playing environment. Then, the collected audio sound is analyzed in real time. First, it will filter out the audio sound from the intelligent speaker itself and keeps the other sound in the playing environment. It should be understood that when the intelligent speaker is playing an audio, the intelligent speaker will obtain sound information of the audio to be played in advance, and the audio sound of the intelligent speaker itself can be filtered out from the complicated ambient sound by presetting the obtained sound information.

In addition, it is also possible to collect sound samples from different devices and users, and then input the collected sound samples into a neural network model for learning and training, so as to distinguish different sound types in the ambient sound using the neural network model.

In addition, the human voice can also be acquired through voice recognition, and a voice message is regarded as the human voice when it is recognized through the voice recognition. Since devices like televisions can also broadcast voice, voice frequency can be used for distinction between the human voice and the device sound according to a difference between a voice frequency from a person and a sound frequency from the electronic device.

Step 202, determine main sound included in the ambient sound.

Specifically, the main sound included in the ambient sound is determined after the microphone of the intelligent speaker successfully picks up the sound, where the main sound has a strongest preset sound characteristic among all sound types included in the ambient sound, for example, it can be the loudest sound, the most frequent sound, or the sound that lasts the longest.

Step 203, adjust a volume of the audio sound according to the main sound and a preset sound adjustment rule.

Finally, the volume of the audio sound is adjusted according to the main sound and the preset sound adjustment rule. In an embodiment, the specific sound adjustment rule is as below:

In a possible case, a duration during which the human voice is monitored is calculated a when the main voice is the human voice; the volume of the audio sound is turned down if the duration exceeds a first preset duration, and the volume of the audio sound is adjusted to an original volume if a stop duration of the human voice exceeds a second preset duration.

Specifically, calculation may start when the human voice, for example a voice of a conversation, is monitored. If the human voice lasts for 2 minutes, the volume of the intelligent speaker is lowered initiatively, so that people can carry on the conversation comfortably. However, when it is monitored that the person is no longer speaking for 1 minute and background sound tends to be mute, the volume of the intelligent speaker gradually returns to a state before adjustment.

In another possible case, a duration of the device voice during which the device voice is monitored is calculated when the main voice is the device voice; the volume of the audio sound is turned down if the duration exceeds a third preset duration, and the volume of the audio sound is adjusted to the original volume if a stop duration of the device voice exceeds a fourth preset duration.

Specifically, calculation may start when the device sound from other devices is monitored. If the device sound played by the other devices lasts for 2 minutes, the volume of the intelligent speaker will be lowered initiatively, so that people can hear the sound from other devices clearly, where the sound of the intelligent speaker may be lowered to the background sound. However, when the sound from other devices is turned off and the sound from other devices is not monitored for 1 minute, the volume of the intelligent speaker is adjusted to gradually return to the state before adjustment.

In another possible case, the volume of the audio sound is turned down when it is unable to determine the main sound. For example, the ambient sound obtained by the intelligent speaker is noisy sound. At this time, the background sound is relatively messy and it is unable to judge which sound is dominant. Because the sound in this environment is already very complicated, in order to avoid the sound of the intelligent speaker from making the ambient sound noisier, the volume of the intelligent speaker can then be immediately adjusted to be lower, thereby reducing a noise degree of the ambient sound.

In addition, if the adjustment instruction sound is received within a preset fifth duration and the adjustment instruction sound is used to indicate the terminal device to adjust in a direction opposite to that of a latest sound adjustment, the terminal device stops automatically adjusting the audio sound. For example, after the volume is turned down or turned up, if the user actively adjusts in an opposite direction within 5 minutes, the above volume adjustment strategy is no longer applied to the device, so as to prevent the case where the volume adjustment strategy is not appropriate for this scenario due to different scenarios used by the user.

The embodiment, by determining main sound included in ambient sound that is acquired by the terminal device, and adaptive adjusting a volume of the audio sound according to the main sound and a preset sound adjustment rule, enables the terminal device to adopt an adaptive adjustment manner to control the volume under different working environments, thereby outputting a volume that meets a user's current demand for the user.

Figure 3:
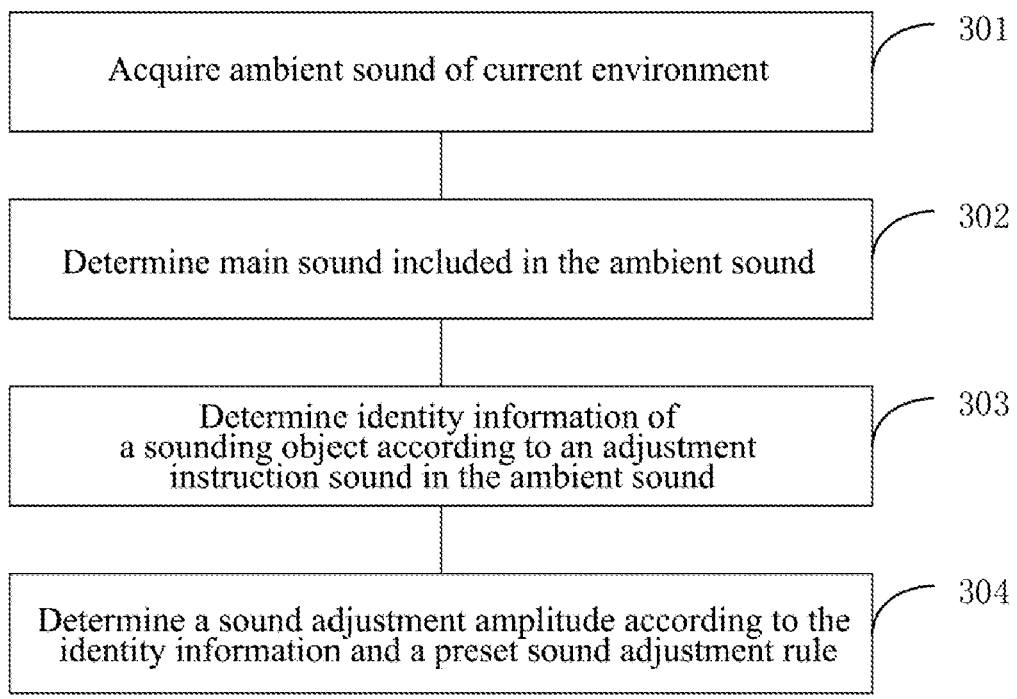
FIG. 3 is a schematic flowchart of a volume adjustment method according to another exemplary embodiment of the present disclosure.

FIG. 3 is a schematic flowchart of a volume adjustment method according to another exemplary embodiment of the present disclosure. As shown in FIG. 3, the volume adjustment method provided in the embodiment includes:

Step 301, acquire ambient sound of current environment.

Step 302, determine main sound included in the ambient sound.

It is worth noting that detailed descriptions of steps 301 to 302 in the embodiment can be referred to the descriptions of steps 201 to 202 in the embodiment shown in FIG. 2, which will not be repeated herein.

Step 303, determine identity information of a sounding object according to an adjustment instruction sound in the ambient sound.

Considering that a degree of perception for each user's voice is different, before the volume is adjusted according to user instructions, it is necessary to obtain the identity information of the sounding object in advance; in an embodiment, the identity information can be divided according to an age of the user, for example, the identity information can include: children type, youth type and elderly type.

As for a specific way to determine the user's identity type based on awake-up sound instruction, it is possible to first determine tone information, loudness information and frequency information of the wake-up sound instruction, and then determine the identity type according to a preset classification rule, the tone information, the loudness information and the frequency information. It should be appreciated that for users of different ages, the sound characteristics are usually different. For example, for the elderly, a sound loudness is usually low, while for the young, the sound loudness is high, and for children, the sound frequency is relatively high.

In addition, it is also possible to collect sound samples of different ages, and then input the collected sound samples into a neural network model for learning and training, so as to use the neural network model to determine the identity type of the sounding object of the input wake-up sound instruction.

Step 304, determine a sound adjustment amplitude according to the identity information and the preset sound adjustment rule.

After the identity information of the user is confirmed, different volume adjustment schemes based on different identity information can make the adopted adjustment scheme applicable to the user characteristics of different types of users. It should be noted that, for example, if the user's identity information is confirmed to be an elderly user, a volume for playing music may be adjusted to be relatively louder when the music is played in response to awake-up sound instruction of "playing music" given by the elderly, for example level 30; and the volume for playing the music may be adjusted to be relatively lower when the music is played in response to awake-up sound instruction of "playing music" given by the children, for example level 20. It should be noted that, in the embodiment, a value of the volume level, such as 20 or 30, is for the illustrative purpose only, and may be adapted according to a volume setting rule of an actual terminal device.

In addition, when the volume is turned up in response to awake-up sound instruction of "louder" given by the elderly, an amplitude for each volume adjustment can be set to a large value, for example, it can be adjusted by 5 levels each time; while the volume is turned up in response to awake-up sound instruction of "louder" given by the children, the amplitude for each volume adjustment can be set to a small value, for example, it can be adjusted by 2 levels each time. It should be noted that, in the embodiment, the value of the volume level, such as 5 or 2, is for the illustrative purpose only, and may be adapted according to the volume setting rule of the actual terminal device.

The embodiment, by first obtaining an adjustment instruction sound input by a user, and then determining identity information of the user at different ages according to the adjustment instruction sound, and finally adjusting a playing volume of audio sound from a terminal device according to the identity type and a preset sound adjustment rule, enables the volume adjustment of the terminal device to be applicable to users with different sensitivity to sound, and improves a volume adjustment efficiency of the user.

Figure 4:
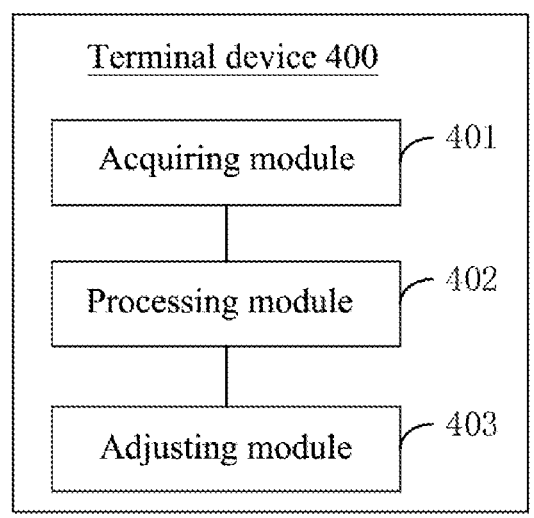
FIG. 4 is a schematic structural diagram of a terminal device according to an exemplary embodiment of the present disclosure.

FIG. 4 is a schematic structural diagram of a terminal device according to an exemplary embodiment of the present disclosure. As shown in FIG. 4, the terminal device provided in the embodiment includes:

an acquiring module 401, configured to acquire ambient sound of current environment;

a determining module 402, configured to determine main sound included in the ambient sound, where the main sound has a strongest preset sound characteristic among all sound types included in the ambient sound, and the sound types include audio sound, human voice, and device sound, where the audio sound is played by the terminal device; and an adjusting module 403, configured to adjust a volume of the audio sound according to the main sound and a preset sound adjustment rule.

In a possible design, the adjusting module 403 is specifically configured to:

calculate a duration during which the human voice is monitored when the main voice is the human voice; and turn down the volume of the audio sound if the duration exceeds a first preset duration.

In a possible design, the adjusting module is further configured to adjust the volume of the audio sound to an original volume if a stop duration of the human voice exceeds a second preset duration.

In a possible design, the adjusting module 403 is specifically configured to:

calculate a duration during which the device voice is monitored when the main voice is the device voice; and turn down the volume of the audio sound if the duration exceeds a third preset duration.

In a possible design, the adjusting module 403 is further configured to adjust the volume of the audio sound to an original volume if a stop duration of the device voice exceeds a fourth preset duration.

In a possible design, the adjusting module 403 is specifically configured to:

turn down the volume of the audio sound when it is unable to determine the main sound.

In a possible design, the processing module 402 is specifically configured to:

determine identity information of a sounding object according to an adjustment instruction sound in the ambient sound; and determine a sound adjustment amplitude according to the identity information and the preset sound adjustment rule.

In a possible design, the adjusting module 403 is further configured to stop automatically adjusting the audio sound if the adjustment instruction sound is received within a preset fifth duration and the adjustment instruction sound is used to indicate the terminal device to adjust in a direction opposite to that of a latest sound adjustment.

The above back-end processing module 402 can be configured to as one or more integrated circuits implementing the above method, for example, one or more Application Specific Integrated Circuits (ASICs), or one or more microprocessors (digital signal processors, DSPs for short), or one or more Field Programmable Gate Arrays (FPGAs), etc. For another example, when one of the above modules is implemented in the form of a processing element schedule code, the processing element may be a general-purpose processor, such as a Central Processing Unit (CPU) or other processors that can call program code. Alternatively, these modules can be integrated together and implemented in the form of a system-on-a-chip (SOC).

In addition, the functional units in each embodiment of the present disclosure may be integrated into a processing unit, or may be physically separate from each other, or two or more units may be integrated into a single unit. The above integrated unit may be implemented in the form of hardware, or in the form of hardware plus software functional unit.

It is worth noting that the terminal device in the embodiment shown in FIG. 4 may be used to perform the method of the embodiment shown in above FIG. 2 to FIG. 3, and the implementation manner and the technical effect thereof are similar, which will not repeated herein.

The present disclosure further provides a computer readable storage medium having a computer program stored thereon, where, the computer program, when executed by a processor, implements the technical solution of any of the above method embodiments. The implementation principles and technical effects are similar, and are not described herein.

Figure 5:
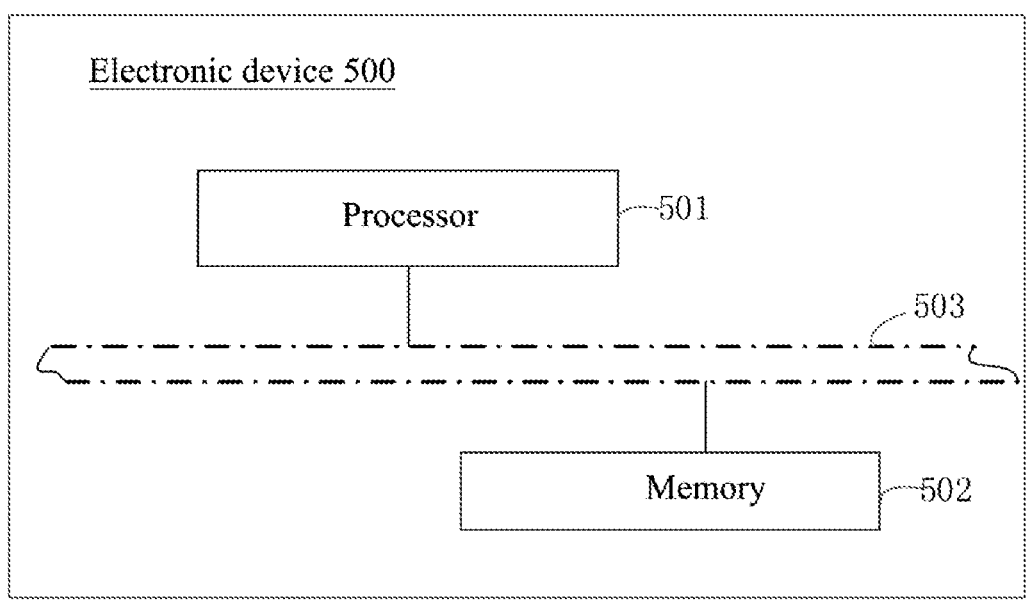
FIG. 5 is a schematic structural diagram of an electronic device according to an exemplary embodiment of the present disclosure.

FIG. 5 is a schematic structural diagram of an electronic device according to an exemplary embodiment of the present disclosure. As shown in FIG. 5, the electronic device 500 provided in the embodiment includes:

a processor 501 and a memory 502; where the memory 502 is configured to store computer programs, and the memory can also be a flash memory.

The processor 501 is configured to execute instructions stored in the memory to implement the steps in the above method. For details, reference may be made to the related descriptions in the previous method embodiments.

In an embodiment, the memory 502 can be either stand-alone or integrated with the processor 501.

When the memory 502 is a device independent of the processor 501, the electronic device may also include:

a bus 503, configured to connect the memory 502 and the processor 501.

The embodiment further provides a programming product that includes a computer program stored in a readable storage medium. At least one processor of an electronic device can read the computer program from the readable storage medium, and the at least one processor executes the computer program to enable the electronic device to implement the methods provided by the various embodiments described above.

A person of ordinary skill in the art may understand that all or part of the steps to implement the above method embodiments can be accomplished by means of a hardware associated with program instructions. The preceding program may be stored in a computer readable storage medium. When the program is executed, the steps including the above method embodiments are executed; and the above storage medium includes: read only memory (ROM), random access memory (RAM), disk or optical disk and other media that can store the program code.

Finally, it should be noted that the above embodiments are merely for illustrating, instead of limiting the technical solutions of the present disclosure. Although the present disclosure has been illustrated in detail with reference to the above embodiments, a person ordinarily skilled in the art should understand that the technical solutions described in the above embodiments may be modified or equivalently substituted for some or all of the technical features, and the modifications and substitutions do not cause the essence of the corresponding technical solutions depart from the scope of the technical solutions of the embodiments of the present disclosure.

What is claimed is:

1. A volume adjustment method, applied to a terminal device and comprising:
    acquiring ambient sound of current environment;
    determining main sound comprised in the ambient sound, wherein the main sound has a strongest preset sound characteristic among all sound types comprised in the ambient sound, and the sound types comprise audio sound, human voice, and device sound, wherein the audio sound is played by the terminal device; and
    adjusting a volume of the audio sound according to the main sound and a preset sound adjustment rule;
    wherein the adjusting a volume of the audio sound according to the main sound and the preset sound adjustment rule, comprises:
    calculating a duration during which the device voice is monitored when the main voice is the device voice; and
    turning down the volume of the audio sound if the duration exceeds a third preset duration.

2. The volume adjustment method of claim 1, wherein the adjusting a volume of the audio sound according to the main sound and the preset sound adjustment rule, comprises:
    calculating a duration during which the human voice is monitored when the main voice is the human voice; and
    turning down the volume of the audio sound if the duration exceeds a first preset duration.

3. The volume adjustment method of claim 2, after the turning down the volume of the audio sound, further comprising:
    adjusting the volume of the audio sound to an original volume if a stop duration of the human voice exceeds a second preset duration.

4. The volume adjustment method of claim 1, after the turning down the volume of the audio sound, further comprising:
    adjusting the volume of the audio sound to an original volume if a stop duration of the device voice exceeds a fourth preset duration.

5. The volume adjustment method of claim 1, wherein the adjusting a volume of the audio sound according to the main sound and the preset sound adjustment rule, comprises:
    turning down the volume of the audio sound when it is unable to determine the main sound.

6. The volume adjustment method of claim 1, wherein the adjusting a volume of the audio sound according to the main sound and the preset sound adjustment rule, comprises:
    determining identity information of a sounding object according to an adjustment instruction sound in the ambient sound; and
    determining a sound adjustment amplitude according to the identity information and the preset sound adjustment rule.

7. The volume adjustment method of claim 6, after the adjusting a volume of the audio sound according to the main sound and the preset sound adjustment rule, further comprising:
    stopping, by the terminal device, automatically adjusting the audio sound if the adjustment instruction sound is received within a preset fifth duration and the adjustment instruction sound is used to indicate the terminal device to adjust in a direction opposite to that of a latest sound adjustment.

8. A terminal device, comprising:
a processor; and
a memory, configured to store executable instructions for the processor;
wherein the processor, by executing the executable instructions, is configured to:
acquire ambient sound of current environment;
determine main sound comprised in the ambient sound, wherein the main sound has a strongest preset sound characteristic among all sound types comprised in the ambient sound, and the sound types comprise audio sound, human voice, and device sound, wherein the audio sound is played by the terminal device; and
adjust a volume of the audio sound according to the main sound and a preset sound adjustment rule;
wherein the processor is configured to:
calculate a duration during which the device voice is monitored when the main voice is the device voice; and
turn down the volume of the audio sound if the duration exceeds a third preset duration.

9. The terminal device of claim 8, wherein the processor is configured to:
calculate a duration during which the human voice is monitored when the main voice is the human voice; and
turn down the volume of the audio sound if the duration exceeds a first preset duration.

10. The terminal device of claim 9, wherein the processor is further configured to adjust the volume of the audio sound to an original volume if a stop duration of the human voice exceeds a second preset duration.

11. The terminal device of claim 8, wherein the processor is further configured to adjust the volume of the audio sound to an original volume if a stop duration of the device voice exceeds a fourth preset duration.

12. The terminal device of claim 8, wherein the processor is configured to:
turn down the volume of the audio sound when it is unable to determine the main sound.

13. The terminal device of claim 8, wherein the processor is configured to:
determine identity information of a sounding object according to an adjustment instruction sound in the ambient sound; and
determine a sound adjustment amplitude according to the identity information and the preset sound adjustment rule.

14. The terminal device of claim 13, wherein the processor is further configured to stop automatically adjusting the audio sound if the adjustment instruction sound is received within a preset fifth duration and the adjustment instruction sound is used to indicate the terminal device to adjust in a direction opposite to that of a latest sound adjustment.

15. A computer readable storage medium having a computer program stored thereon, wherein, the computer program, when executed by a processor, implements the volume adjustment method according to claim 1.

16. A terminal device, comprising:
a processor; and
a memory, configured to store executable instructions for the processor;
wherein the processor, by executing the executable instructions, is configured to:
acquire ambient sound of current environment;
determine main sound comprised in the ambient sound, wherein the main sound has a strongest preset sound characteristic among all sound types comprised in the ambient sound, and the sound types comprise audio sound, human voice, and device sound, wherein the audio sound is played by the terminal device; and
adjust a volume of the audio sound according to the main sound and a preset sound adjustment rule;
wherein the processor is configured to:
turn down the volume of the audio sound when it is unable to determine the main sound.

* * * * *